(12) United States Patent
Fong

(10) Patent No.: US 6,851,999 B2
(45) Date of Patent: Feb. 8, 2005

(54) INTERACTIVE LED DEVICE

(76) Inventor: Peter Sui Lun Fong, 297F S. Atlantic Blvd., Monterey Park, CA (US) 91754

( * ) Notice: Subject to any disclaimer, the term of this patent is extended or adjusted under 35 U.S.C. 154(b) by 0 days.

(21) Appl. No.: 10/365,112

(22) Filed: Feb. 12, 2003

(65) Prior Publication Data

US 2004/0067714 A1 Apr. 8, 2004

Related U.S. Application Data

(63) Continuation-in-part of application No. 10/264,797, filed on Oct. 4, 2002.
(51) Int. Cl.[7] ............................................. A63H 30/00
(52) U.S. Cl. ........................................ 446/175; 463/30
(58) Field of Search ................................ 446/175, 484, 446/485; 340/815.4, 815.45, 815.56, 815.6, 815.65, 815.66, 815.91; 463/43, 30, 31

(56) References Cited

U.S. PATENT DOCUMENTS 5,300,864 A * 4/1994 Allen, Jr. .................... 315/314
6,254,486 B1 * 7/2001 Mathieu et al. ................ 463/52
6,265,984 B1 * 7/2001 Molinaroli ............... 340/815.4
6,361,198 B1 * 3/2002 Reed .......................... 362/554
6,424,096 B1 * 7/2002 Lowe et al. ............ 315/185 R
2001/0028227 A1 * 10/2001 Lys et al. .................... 315/317
2003/0137258 A1 * 7/2003 Piepgras et al. ............ 315/291
2003/0213045 A1 * 11/2003 Fuentes ........................... 2/69

* cited by examiner

Primary Examiner—Kim Nguyen
(74) Attorney, Agent, or Firm—Stetina Brunda Garred & Brucker

(57) ABSTRACT

An interactive light emitting diode display having a plurality of individual light-emitting diode units. Each light-emitting diode unit further has at least one light-emitting diode die, an individual driving circuit operative to drive the light-emitting diode die, a micro-controller unit operative to transmit a driving signal to the driving circuit and an activation/inactivation signal, and a transceiver operative to transmit the activation/inactivation signal to activate/inactivate another light-emitting diode unit, and to receive an external activation/inactivation signal.

23 Claims, 3 Drawing Sheets

| 100 | 100 | 100 | 100 | 100 |
|-----|-----|-----|-----|-----|
| 100 | 100 | 100 | 100 | 100 |
| 100 | 100 | 100 | 100 | 100 |
| 100 | 100 | 100 | 100 | 100 |

10

INTERACTIVE LED DEVICE

CROSS-REFERENCE TO RELATED APPLICATIONS

This application is a continuation-in-part of U.S. application Ser. No. 10/264,797 entitled INTERACTIVE DEVICE LED DISPLAY filed Oct. 4, 2002.

STATEMENT RE: FEDERALLY SPONSORED RESEARCH/DEVELOPMENT (Not applicable)

BACKGROUND OF THE INVENTION

The present invention relates generally to a light-emitting diode (LED) display and, more particularly, to a light emitting diode display having a plurality of interactive light-emitting diode units.

Light-emitting diodes having various sizes and display effects have been developed and are available in the market. For example, large area flat panel displays are obtained by the integration of multiple light-emitting diodes on the same substrate. When the number of the light-emitting diodes integrated on the same substrate increases, the design of the circuit for driving the light-emitting diode display becomes more complex, thus increasing the difficulty of the fabrication process and, consequently, the cost of the driving circuit. Typically, a conventional light-emitting diode display is disposed on a flat surface to provide a two-dimensional visual effect. Alternatively, for a specific uneven surface or a specific three-dimensional object, the substrate of the light-emitting diode display may be pre-designed conformal to the uneven surface or the geometric feature of the three-dimensional object. In such manner, the application of the light-emitting diode display is restricted to a specific uneven surface or a specific three-dimensional object.

SUMMARY OF THE INVENTION

The present invention provides an interactive light-emitting diode display comprising a plurality of individual light-emitting diode units. Each of the light-emitting diode units comprises at least one light-emitting diode die, an individual driving circuit, a micro-controller and a transceiver. The driving circuit is used to drive the light-emitting diode die. The micro-controller unit is used to transmit a driving signal to the driving circuit and to generate an activation signal. The transceiver is operative to transmit the activation signal to other light-emitting diode units and to receive an external activation signal.

To obtain a color effect, the light-emitting diode die further comprises a set of color light-emitting diodes; for example, a red light-emitting diode, a green light-emitting diode, and a blue light-emitting diode. When the micro-controller unit generates and transmits the driving signal to the driving circuit, voltages are transmitted from the driving circuit to the light-emitting diode die to display a pattern in response to the driving signal. The transceiver is operative to receive and transmit the activation signal generated by the micro-controller unit, and to receive and transmit external activation signals in the form of an infrared signal, radio-frequency signal, audible sound and/or ultrasound.

Each of the interactive light-emitting diode units may further comprise a memory pre-storing a plurality of illumination patterns. When activated by an external activation signal, the micro-controller unit is operative to read the illumination pattern provided or carried by the external activation signal. The micro-controller unit is further operative to generate a driving signal in response to the illumination pattern and, preferably, in response to activation signals transmitted by one or more other objects such as other interactive light-emitting diode units. The interactive light-emitting diode display may further comprise a remote control for activating at least one of the light-emitting diode units.

The present invention further provides an interactive display device comprising a plurality of individual objects each having an individual display unit disposed thereon and a switching device operative to activate the display unit of at least one of the objects. The display unit of each object further comprises at least one light-emitting diode die, an individual driving circuit, a micro-controller and a transceiver. The driving circuit supplies voltages to the light-emitting diode die, the micro-controller unit generates the driving signal upon activation by the switching device, and the transceiver generates an activation signal to activate the display unit of at least one of the other objects. The transceiver is further operative to receive an activation signal generated by the other objects.

In one embodiment, the display unit may also be activated by an activation signal transmitted from the transceiver of other objects. The objects may comprise a plurality of toys, ornaments, flat panels, curved panels, and/or substrates. To provide a color effect, the light-emitting diode die comprises at least a set of color light-emitting diodes. For example, the set of color light-emitting diodes may comprise at least a red, a green and a blue light-emitting diode. The switching device may include a built-in switch directly accessible to a user and/or a remote control.

The objects may have different shapes. For example, the objects may have a shape correlated to a predefined pattern to be displayed by the display unit thereof. Similarly, the objects may have different sizes. The pattern to be displayed by the display unit of each object is programmable.

BRIEF DESCRIPTION OF THE DRAWINGS

These, as well as other features of the present invention, will become more apparent upon reference to the drawings wherein.

DETAILED DESCRIPTION OF THE INVENTION

Figures 1, 2:
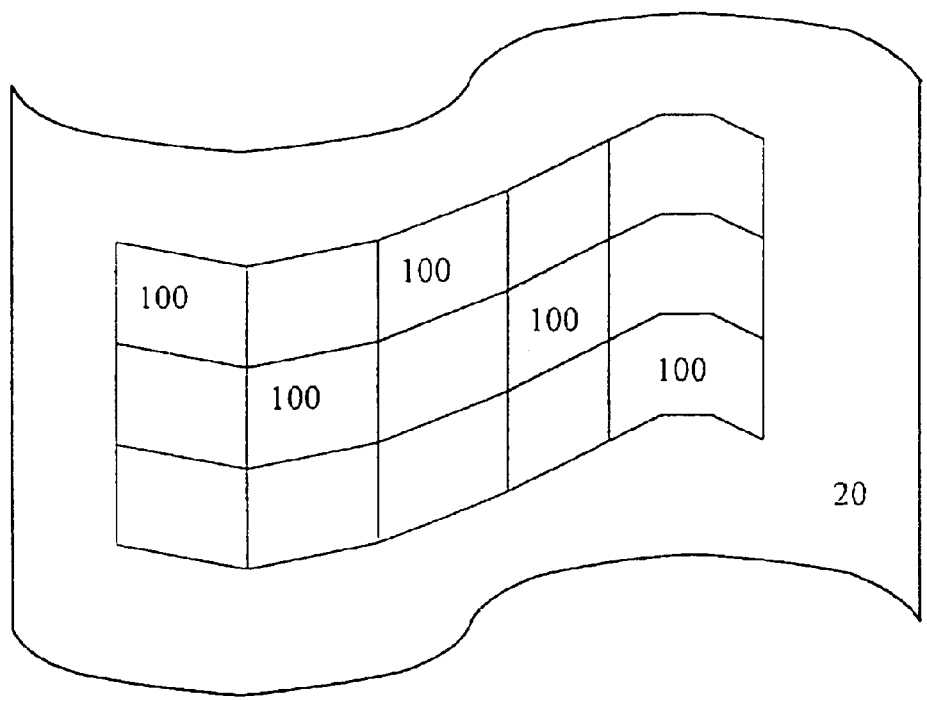
FIG. 1 is a perspective view of an interactive light-emitting diode (LED) display mounted on a flat panel.
FIG. 2 is a perspective view of an interactive light-emitting diode display mounted on a curved panel.
Figure 3:
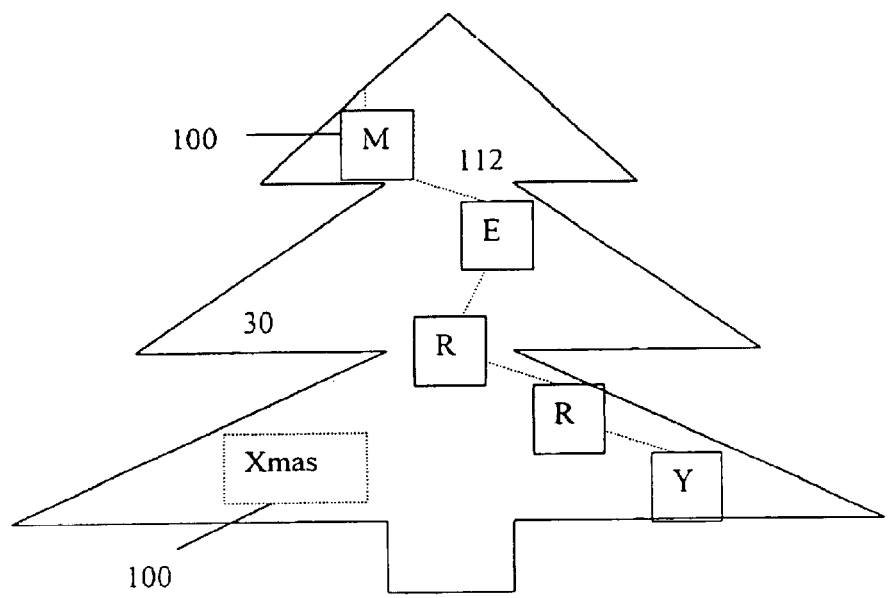
FIG. 3 is a perspective view of an interactive light-emitting diode display mounted to a Christmas tree.

Referring now to the drawings wherein the showings are for purposes of illustrating preferred embodiments of the present invention only, and not for purposes of limiting the same, FIGS. 1 to 4 perspectively illustrate an interactive light-emitting diode display with a set of individual light-emitting diode units 100 applied to various objects. FIG. 1 shows a plurality of light-emitting diode units 100 mounted on a flat panel 10. The light-emitting diode units 100 are arranged as an array. FIG. 2 shows the light-emitting diode units 100 arranged along a curved surface of a panel 20. To provide a continuous display effect, the neighboring light-emitting diode units 100 are disposed adjacent each other as shown in FIGS. 1 and 2. It is appreciated that to provide specific visual effects or to accommodate specific surface topology, gaps may be reserved between the neighboring light-emitting diode units 100. In FIG. 3, the light-emitting diode units 100 illustrated by solid lines indicate those light-emitting diode units 100 located on the front side of a Christmas tree 30, while those drawn in dashed lines indicate those light-emitting diode units 100 located on the rear side thereof. As shown in FIG. 3, each individual light-emitting diode unit 100 can be disposed at any of various parts of the Christmas tree 30 regardless of the location of any other individual light-emitting diode unit 100.

Figure 4:
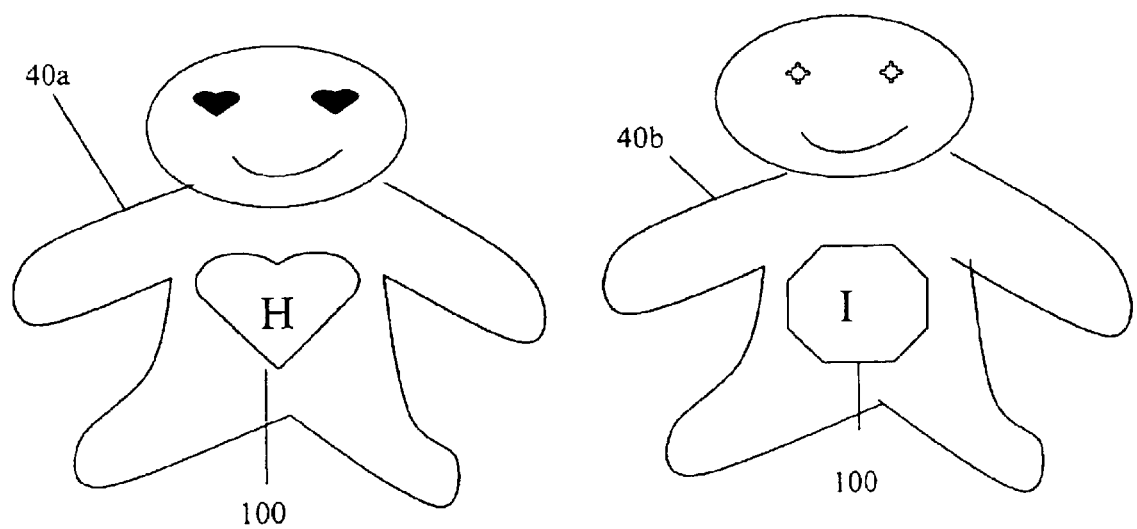
FIG. 4 is a perspective view of an interactive light-emitting diode display disposed on a set of toys.

Means for mounting the light-emitting diode units 100 on the Christmas tree 30 include hook, tape, string, or wire for each individual light-emitting diode unit 100. Alternatively, the light-emitting diode unit 100 can be linked by a string 112 illustrated by dashed lines in FIG. 2 before being mounted to the Christmas tree 30. FIG. 4 shows a set of toys 40 each having an individual light-emitting diode unit 100. Each toy 40 may comprise a plastic toy, a plush toy animal, stuffed fabric toy figure, fabric doll, a plastic doll with a stuffed body, or another inanimate object.

Each of the light-emitting diode units 100 is designed to include an individual driving circuit to enable each light-emitting diode unit 100 to function and display independently. Further, as each light-emitting diode unit 100 can operate independently, the light-emitting diode units 100 can be fabricated into separate entities and randomly arranged with various configurations and geometries as desired.

The light-emitting diode units 100 are interactive. When one of the light-emitting diode unit 100 is activated, one or more other light-emitting diode units 100 may be activated by an activation signal output by the activated light-emitting diode unit 100 to display a predefined pattern. The display of different light-emitting diode units 100 may be simultaneous or with a predetermined sequence. That is, each light-emitting diode unit 100 is designed to display its predefined pattern according to a specific timing program. Therefore, various visual effects can be provided. For example, as shown in FIG. 3, when the first light-emitting diode unit 100 is activated to display the letter "M", by outputting an activation signal from the first light-emitting diode unit 100 to other light-emitting diode units 100, the phrase "Merry Xmas" will be displayed. In this example, the second to fifth light-emitting diode units 100 are designed to display the letters "E", "R", "R", "Y", respectively, while the sixth light-emitting diode unit 100 is designed to display the word "Xmas" upon reception of the activation signal. According to a specific design, these six light-emitting diode units 100 may display simultaneously. That is, when one of the light-emitting diode units 100 is activated, an activation signal to activate other light-emitting diode unit 100 is spontaneously generated and output. Thereby, all the light-emitting diode units 100 are operative to simultaneously illuminate the predefined pattern. Alternatively, the light-emitting diode units 100 may display the phrase "Merry Xmas" in a predetermined sequence. For example, while being activated, each of the light-emitting diode units 100 may be designed to illuminate its predefined pattern with various delays. In this way, the illuminated pattern "M", "E", "R", "R", "Y" and "Xmas" may be displayed one after another.

Similarly, in FIG. 4, a set of two soft toys 40*a* and 40*b* each having a light-emitting diode unit 100 is provided. When one of the soft toys 40*a* is activated, by a switch or a remote control, to display the letter "H", the other soft toy 40*b* may be activated to display "I" simultaneously or subsequent to the soft toy 40*a* by a time delay. The soft toy 40*b* may be activated by the same or another switch or remote control, though it is preferably activated by an activation signal generated by the soft toy 40*a*. Once the soft toy 40*b* is activated to display "I", the soft toy 40*b* may further generate an activation signal to reciprocally activate the soft toy 40*a*. Thereby, the soft toys 40*a* and 40*b* are mutually interactive to obtain a specific display pattern and visual effect. The set of toys may comprise more than two soft toys to provide more options of displayed patterns. Though the embodiment illustrated in FIG. 4 discloses soft toys 40*a* and 40*b* each having a light-emitting diode unit 100 operative to display a single letter, it will be appreciated that the displayed pattern of the light-emitting diode unit 100 is not limited to single letter only. Other patterns such as multiple letters, outlines of particular objects, signs, and/or symbols can also be designed and pre-programmed in the light-emitting diode unit 100. Therefore, the set of toys may provide a significant learning and visual effect. For example, according to the displayed sequence of the letter in each soft toy, a user (e.g., a young child) can rearrange the soft toys to correctly spell a word the set of soft toys is preprogrammed to present.

A detailed description of the interactive action between the light-emitting diode units 100 is provided in U.S. Pat. No. 6,309,275 entitled INTERACTIVE TALKING DOLLS issued Oct. 30, 2001, and U.S. Pat. No. 6,497,604 entitled INTERACTIVE TALKING DOLLS issued Dec. 24, 2002, incorporated herein by reference.

Figure 5:
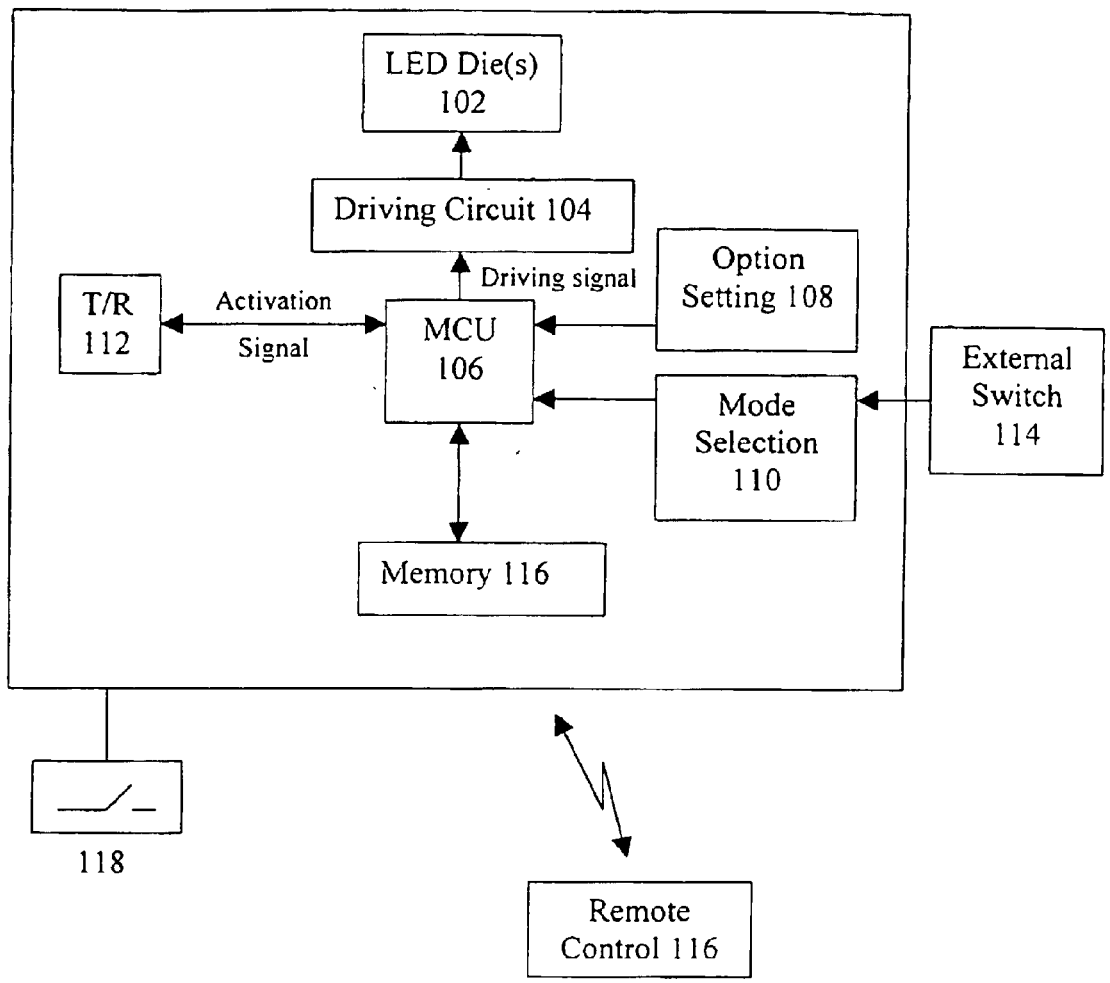
FIG. 5 is a block diagram of the interactive light-emitting diode display.

Referring now to FIG. 5, there is shown a block diagram of one of the light-emitting diode units 100. As shown in FIG. 5, each light-emitting diode unit 100 comprises at least one light-emitting diode die 102. Depending on the specific size and illumination pattern required, multiple light-emitting diode dies 102 may be incorporated in each light-emitting diode unit 100. For example, when the light-emitting diode unit 100 is designed to illuminate a single spot light, only one light-emitting diode die 102 is required. When a particular pattern is required, a plurality of light-emitting diode dies 102 is required. Preferably, when a plurality of light-emitting diode dies 102 is used, the light-emitting diode dies 102 are arranged as a dot-matrix display. For a monochromatic display, each light-emitting diode die 102 may include only one light-emitting diode. For a color display, each light-emitting diode die 102 may comprise at least two color light-emitting diodes. Preferably, to obtain a full-color effect, the light-emitting diode die 102 comprises a set of red (R), green (G) and blue (B) light-emitting diodes. Further, the number of light-emitting diode dies 102 of each light-emitting diode unit 100 in the same light-emitting diode display may vary from one to the other, while the size of each individual light-emitting diode unit 100 may also vary.

Each light-emitting diode die 102 is driven by a driving circuit 104. As mentioned above, each of the light emitting diode units 100 has its own driving circuit. Therefore, the light-emitting diode units 100 can be formed on different substrates (not shown) with various exterior features including length, width, height, and shape. For example, to provide more entertaining or educational effect, the light-emitting diode display may include a light-emitting diode unit 100 with the shape of a moon, a light-emitting diode unit 100 with a shape of a sun, and a light-emitting diode unit 100 with a shape of a star. In this example, the moon, sun and star units may be designed to display the word "moon", "sun" and "star", respectively. Therefore, the user, particularly a young child, may be impressed by the meaning of particular words. That is, by combining the exterior features and the predefined display patterns of each light-emitting unit 100, a visual and learning effect can be obtained. In this embodiment, the predefined display patterns can be pre-stored in a memory 116.

The light-emitting diode unit 100 further comprises a micro-controller unit (MCU) 106, a main switch 118, and a mode selection device 110. Preferably, the main switch 118 is located at a position accessible to the user. Once the main switch 118 is turned on, the light-emitting diode unit 100 is preferably in a sleep mode to maintain an on-status with reduced power consumption. When a play mode is selected via the mode selection device 110, the micro-controller unit 106 generates and transmits a driving signal to the driving circuit 104. Meanwhile, an activation signal may be generated by the micro-controller unit 106 and transmitted by the transceiver (T/R) 112 to other light-emitting diode units 100. The driving circuit 104 then provides the appropriate voltage to the light-emitting diode die 102 so that a desired pattern can be illuminated. Preferably, the mode selection unit 110 further comprises an external switch 114 disposed at an accessible location, allowing the user to choose the operation mode of the light-emitting diode unit 100. In addition to the external switch 114, the mode may also be selected upon the reception of an activation signal generated by another light-emitting diode unit 100. Under the play mode, the micro-controller unit 106 may be designed to transmit the activation signal to the transceiver 112 with a time delay after the play mode is selected. Alternatively, under the play mode, the mode selection unit 110 may be disabled by the micro-controller unit 106 for a predetermined period of time, and enabled again after this period of time. In addition to the play mode, the operation mode of the light-emitting diode unit 100 further comprises a programming mode, allowing the user to redesign the display pattern, display sequence and operation sequence thereof.

Each light-emitting diode unit 100 may further comprise a remote control 116 controlling the on/off status and the operation mode thereof. The remote control 116 can also be used to program the light-emitting diode unit 100 under the programming mode. The activation signal may be transmitted between the light-emitting diode units 100 via an audible sound, ultrasound, radio frequency, and/or infrared signal, each requiring a specific signal modulator or generator.

As mentioned above, when a play mode is selected by the mode selection unit 110, the micro-controller unit 106 transmits a driving signal to the driving circuit 104. In response to the driving signal, the driving circuit 104 supplies appropriate voltages to the light-emitting diode die(s) 102. The information carried by the driving signal may includes on/off timing, light intensity or brightness, on/off frequency, or flashing rate of each light-emitting diode of the light-emitting diode die 102. Thus, the light-emitting diode unit 100 can display a stationary pattern or an animated light pattern with three-dimensional visual effect.

A detailed description of the light-emitting diode die(s) 102 is provided by U.S. application Ser. No. 10/264,797 entitled INTERACTIVE DEVICE LED DISPLAY filed Oct. 4, 2002 and incorporated herein by reference.

Additional modifications and improvements of the present invention may be apparent to those skilled in the art. Thus, the particular combination of parts described and illustrated herein is intended to represent only one embodiment of the present invention, and is not intended to serve as a limitation of alternative devices within the spirit and scope of the invention.

What is claimed is:

1. An interactive light-emitting diode display, comprising a plurality of individual light-emitting diode units, each light-emitting diode unit comprising:
    at least one light-emitting diode die;
    an individual driving circuit operative to drive the light-emitting diode die;
    a micro-controller unit operative to generate a driving signal to the driving circuit and to generate an activation signal; and
    a transceiver operative to transmit the activation signal to activate another light-emitting diode unit, and to receive an external activation signal.

2. The interactive light-emitting diode display of claim 1, wherein the light-emitting diode die further comprises at least a red light-emitting diode, a green light-emitting diode, and a blue light-emitting diode.

3. The interactive light-emitting diode display of claim 1, wherein the driving circuit is operative to drive the light-emitting diode die to display a pattern in response to the driving signal generated by the micro-controller unit.

4. The interactive light-emitting diode display of claim 1, wherein the transceiver is operative to receive and transmit the activation signal generated by the micro-controller unit in the form of an infrared signal.

5. The interactive light-emitting diode display of claim 4, wherein the transceiver is operative to receive and transmit the external activation signal in the form of an infrared signal.

6. The interactive light-emitting diode display of claim 1, wherein the transceiver is operative to receive and transmit the activation signal generated by the micro-controller unit in the form of a radio-frequency signal.

7. The interactive light-emitting diode display of claim 6, wherein the transceiver is operative to receive and transmit the external activation signal in the form of a radio-frequency signal.

8. The interactive light-emitting diode display of claim 1, wherein each of the light-emitting diode units further comprises a memory pre-storing a plurality of illumination patterns.

9. The interactive light-emitting diode display of claim 8, wherein the micro-controller unit is further operative to read an illumination pattern in response to the external activation signal.

10. The interactive light-emitting diode display of claim 9, wherein the micro-controller unit is further operative to generate the driving signal in response to the illumination pattern.

11. The interactive light-emitting diode display of claim 1, further comprising a remote control for activating at least one of the light-emitting diode units.

12. The interactive light-emitting diode display of claim 1, wherein the individual light-emitting diode units comprise a plurality of flat panels.

13. The interactive light-emitting diode display of claim 1, wherein the individual light-emitting diode units comprise a plurality of curved panels.

14. The interactive light-emitting diode display of claim 1, wherein the individual light-emitting diode units are integrated on a common substrate.

15. The interactive light-emitting diode display of claim 1, wherein the light-emitting die comprises at least a set of color light-emitting diodes.

16. The interactive light-emitting diode display of claim 1, wherein the light-emitting die comprises at least a set of red, green and blue light-emitting diodes.

17. The interactive light-emitting diode display of claim 1, wherein the micro-controller unit is further operative to generate the driving signal in response to the activation signal transmitted by other objects.

18. The interactive light-emitting diode display of claim 1, wherein the transceiver is operative to transmit and receive an infrared signal.

19. The interactive light-emitting diode display of claim 1 wherein the transceiver is operative to transmit and receive a radio frequency signal.

20. The interactive light-emitting diode display of claim 1 wherein the transceiver is operative to transmit and receive an audible sound.

21. The interactive light-emitting diode display of claim 1, wherein the transceiver is operative to transmit and receive an ultrasound.

22. The interactive light-emitting diode display of claim 1, wherein the light-emitting diode units have different sizes.

23. The interactive light-emitting diode display of claim 1, wherein a pattern to be displayed by the light-emitting diode unit is programmable.

* * * * *